United States Patent [19]
Steckler

[11] 3,840,819
[45] Oct. 8, 1974

[54] SIGNAL COMBINING CIRCUIT

[75] Inventor: Steven Alan Steckler, Clark, N.J.
[73] Assignee: RCA Corporation, New York, N.Y.

[22] Filed: Dec. 29, 1972
[21] Appl. No.: 319,365

[52] U.S. Cl. .................... 330/30 D, 330/19, 330/22
[51] Int. Cl. .................... H03f 3/68
[58] Field of Search ............... 330/19, 22, 30 D, 69

[56] References Cited
UNITED STATES PATENTS

| | | | |
|---|---|---|---|
| 3,614,645 | 10/1971 | Wheatley, Jr. | 330/30 D |
| 3,619,798 | 11/1971 | Smith | 330/30 D X |
| 3,678,406 | 7/1972 | Avins | 330/19 X |

*Primary Examiner*—Herman Karl Saalbach
*Assistant Examiner*—Lawrence J. Dahl
*Attorney, Agent, or Firm*—Eugene M. Whitacre; Kenneth R. Schaefer

[57] ABSTRACT

Apparatus for subtracting a multiple of a first input current from a second input current and for providing an output current responsive to the resulting difference employs three transistors. The emitter electrodes of the first and second transistors are direct current conductively coupled to a reference voltage. The first input current is applied to the interconnected second transistor collector electrode and third transistor base electrode. The second input current is applied to the interconnected first transistor collector and base electrodes, second transistor base electrode and third transistor emitter electrode. The output current is provided from the third transistor collector electrode.

4 Claims, 2 Drawing Figures

SIGNAL COMBINING CIRCUIT

Figure 1:
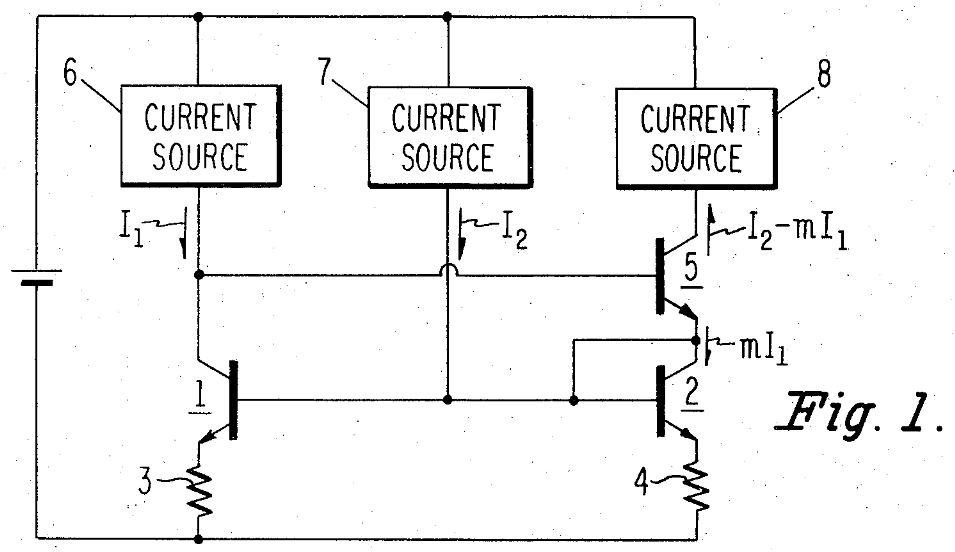

The present invention relates to signal combining circuits and more particularly to a signal combining circuit for subtracting a first input current from a second input current and provides an output current representative of the resulting difference.

Current mirror amplifiers, current amplifiers with minus unity current gain, are known in which input current is applied to the collector electrode of a first transistor having a diode-connected second transistor coupled in parallel with its base-emitter junction and output current is taken from the collector electrode of a third transistor having its base-emitter junction connected between the collector and base electrodes of the first transistor and arranged for forward quiescent current conduction.

Also known from U.S. Pat. No. 3,614,645 is an arrangement where two such current mirror amplifiers are arranged with an interconnection between the emitter electrodes of their respective third transistors, causing the third transistors to function as an emitter-coupled transistor differential amplifier. No current flows through the interconnection for common-mode signal currents applied to the respective input circuits of the two current mirror amplifiers. The interconnection forms a virtual ground for differential input signal currents, because of the bucking between differential emitter signal currents, however. Output signal currents equal to the difference between the input signal currents multiplied by the common-emitter forward current gains (betas) of the third transistors are supplied from the collector electrodes of these third transistors. The first transistors operate to degenerate the the input impedances of the configuration for common mode signals. For differential-mode signals the first transistors and second transistors are statically operated and do not affect the differential amplification in the emitter coupled third transistors. Therefore, differential signal currents applied to their base electrodes are amplified by the full common-emitter forward current gain of the third transistors.

In accordance with the present invention, a signal combining circuit to subtract a multiple of a first input current from a second input current and to provide an output current representative of the resulting difference requires only first, second and third transistors. First and second current sources respectively supply the first and second input currents and in a preferred embodiment of the present invention each has a source impedance substantially larger than twice the reciprocal of the transconductance of the first transistor connected as hereinafter described. A first input terminal accepts the first input current and is connected to the collector electrode of the second transistor and to the base electrode of the third transistor. A second input terminal accepts the second input current and is connected to the base and collector electrodes of a first transistor, the base electrode of the second transistor and the emitter electrode of the third transistor. A common terminal is connected to a source of reference potential, and the emitter electrodes of the first and second transistors are direct current conductively coupled to the common terminal. An output terminal is connected to the collector electrode of the third transistor for supplying the output current to utilization means. A multiple of the first input current is, by virtue of the above-described connections, subtracted from the second input current to provide a difference output current substantially independent of the common-emitter forward current gain of the first, second and third transistors.

Figure 2:
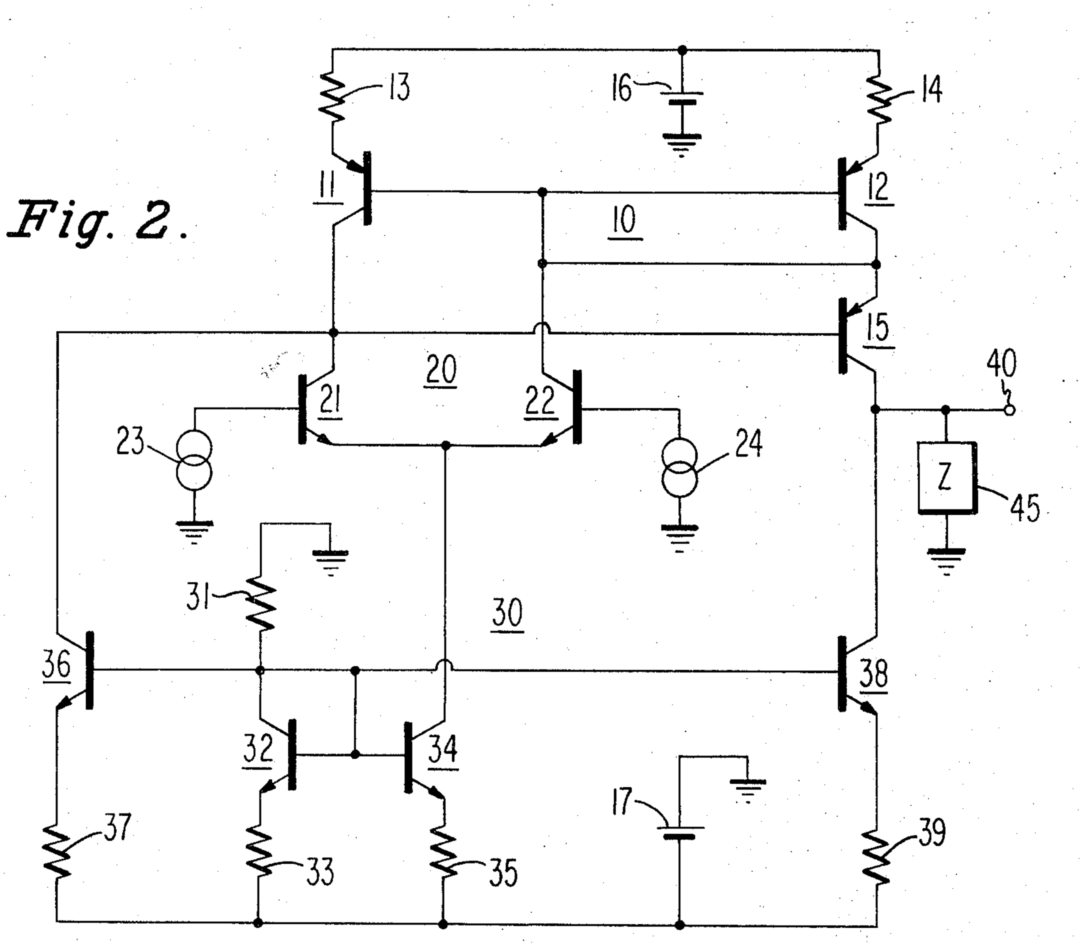

The present invention will be better understood by reference to the following description and the accompanying drawing in which:

FIG. 1 is a schematic diagram of a signal combining circuit embodying the present invention and FIG. 2 is a schematic diagram of a differential amplifier configuration including such a signal combining circuit.

Referring to FIG. 1, transistors 1 and 2 are transistors with similar forward current gain characteristics sharing substantially the same thermal environment, such as transistors with effective areas in ratio 1:*m* located proximate to each other on a common substrate and formed by the same diffusion process. The effective emitter resistances 3 and 4 of transistors 1 and 2, respectively, are in ratio *m*:1. The resistances 3 and 4 may comprise solely the internal emitter resistances of the transistors 1 and 2, which will be substantially in ratio *m*:1 by virtue of their geometry and of the connections shown, or may comprise these internal emitter resistances augmented by external resistors chosen in the ratio *m*:1.

The transistors 1 and 2 have the same potential impressed on their base electrodes and, since the effective emitter resistances 3 and 4 are related by the ratio *m*:1, the emitter currents of transistors 1 and 2 are related in the ratio 1:*m*. Since the transistors have similar forward current gain characteristics, their base currents are related in the same ratio 1:*m*. Since the collector current of a transistor is equal to the sum of its base and emitter currents, the collector currents of transistors 1 and 2 are also in ratio 1:*m*.

The emitter follower action of transistor 5 provides a negative feedback connection between the collector and base electrodes of transistor 1 to regulate the collector current flow $I_1$ of transistor 1 to be substantially equal to that provided by a first current source 6. The current source 6 has a source impedance substantially larger than the collector impedance at the collector electrode of transistor 1 to permit this regulation to be effective. The collector impedance is substantially equal to the sum of two resistances, the first of these resistances being equal to twice the reciprocal of the transconductance of transistor 1 and the second of these resistances being the emitter resistance 3. The transconductance of a transistor is the ratio of its output current to its input voltage.

If the collector current of transistor 1 be decreased with respect to the current $I_1$ from the source 6, the excess current must flow as base current in transistor 5. The excess base current causes an augmented emitter current to flow from transistor 5 (which augmentation is equal to the common collector current gain of the transistor 5 times the excess base current). This augmented emitter current flow is applied to the base electrodes of transistors 1 and 2 to increase their base currents. This base current increase is multiplied by the common-emitter gain of the transistor 1 to increase its collector current and thereby correct its deficiency. Conversely, excessive collector current flow in transistor 1 will starve base current to transistor 5, reducing the base current to transistor 1 from the emitter electrode of transistor 5, and thereby cause transistor 1 collector current to be reduced.

Since the collector current of transistor 2 must be related to that of transistor 1 in the ratio 1:$m$, the collector current of transistor 2 is also regulated by the negative feedback connection provided by the emitter follower action of transistor 5.

Because of the regulator action heretofore described, the current $I_2$ supplied to the joined base electrodes of transistors 1 and 2 from a second current source 7 cannot substantially affect the values of the base currents of transistors 1, 2 or the collector current of transistor 2. The current $I_2$ is constrained to flow so as to provide a portion of the collector current flow $MI_1$ of transistor 2. The remainder of the collector current flow of transistor 2, equal to $mI_1 - I_2$ assuming base currents to be negligible, must be provided from the emitter electrode of transistor 5. A corresponding collector current flow, again assuming base currents to be negligible, may with proper sign reversal to account for a reversal in assumed direction of flow be regarded as an output current $(I_2 - mI_1)$ provided to the utilization means 8. It is to be noted that the magnitude of the output current $(I_2 - mI_1)$ is essentially independent of transistor current gains.

A case of special interest is that in which $m = 1$, that is where the transistors 1, 2 are substantially exactly alike in structure, and emitter resistances 3 and 4 are of the same value. In such instance the output current is $(I_2 - I_1)$—that is, the output current is equal to the difference between the applied input currents.

Referring to FIG. 2, an amplifier is shown which uses a signal combining circuit 10, similar to that shown in FIG. 1, in which $m = 1$. Elements 11, 12, 13, 14, 15 of FIG. 2 correspond with elements 1, 2, 3, 4, 5, respectively of FIG. 1. The signal combining circuit 10 provides an active collector load for a differential amplifier input stage 20 having emitter-coupled transistors 21, 22 accepting input signals referred to ground reference potential at their base electrodes from sources 23, 24, respectively. The active collector load provided by the signal combining circuit 10 requires as little as two base-emitter offset potentials ($2V_{BE}$) of the B supply voltage provided by potential supplies 16, 17, causing little restriction of signal swings as may appear at output terminal 40.

A multiple current supply 30 of conventional design provides a negative output current from the collector electrode of transistor 34 as operating current for the differential amplifier 20, which operating current is applied to the coupled emitters of transistors 21, 22. The direct current component of this operating current is divided equally between the transistors 21, 22. The resultant similar direct current components of the collector currents of transistors 20, 22 are applied to the signal combining circuit 10 and subtract one from the other to provide substantially no direct-current response to such collector currents at terminal 40. Common-mode signals applied to the base electrodes of transistors 21, 22 may affect their collector currents in response to affecting the collector current of transistor 34. Any such variations are also subtracted one from the other in the signal combining circuit to provide no response at terminal 40. Difference-mode signals applied to the base electrodes of transistors 21, 22 cause differentially related collector currents in transistors 21, 22 which when one is subtracted from the other add constructively to vary the collector current of transistor 15.

To permit this collector current variation in response to the aforesaid constructive addition the transistors 11, 12, 15 should be maintained in normal transistor bias mode, with their base-emitter junctions forward biased and their collector-base junctions reverse biased. To provide the former condition of normal transistor biasing an auxiliary bias current is withdrawn from the inverting input circuit of the signal combining circuit 10 to supply the collector current demands of transistor 36. This additional negative input direct current applied as an auxiliary bias current to the inverting input circuit of the signal combining circuit 10 will cause an equal-amplitude positive output device current from the collector electrode of transistor 15.

As shown, this positive direct current is not delivered to the output terminal 40 but rather is used to supply the collector current demand of the transistor 38. This demand is made equal to the supplied positive direct current by making transistors 36, 38 alike and emitter resistances 37, 39 alike. That is, the collector current of transistor 38 is made equal to the auxiliary bias current flowing as the collector current of transistor 36.

The current variations appearing at terminal 40 responsive to the constructively added differential collector current variations of transistors 21, 22 may be referred to ground potential if the impedance element 45 has a direct current path therethrough. The circuit shown in FIG. 2 may also be used as an integrator with the impedance 45 being a capacitor.

Another use of the present invention in controllable oscillators is shown in my concurrently filed U.S. Pat. application Ser. No. (RCA 66,434) entitled "Controlled Oscillator" and assigned to RCA Corporation.

What is claimed is:

1. A signal combining circuit comprising:

first, second and third transistors of similar conductivity type and each having a base, an emitter and a collector electrode;

first and second input current sources for supplying first and said second input currents respectively;

a first input terminal connected to accept said first input current and connected to said first transistor collector electrode and to said third transistor base electrode;

a second input terminal connected to accept said second input current and connected to said first and second transistor base electrodes, to said second transistor collector electrode and to said third transistor emitter electrode;

a common terminal to which said first transistor and said second transistor emitter electrodes are direct current conductively coupled;

an output terminal coupled to said third transistor collector electrode and utilization means coupled to said output terminal and providing a path therethrough for output current supplied by said third transistor;

said first and second transistors having effective areas which are proportionally related, whereby a current component similarly proportionally related to said first input current is subtracted from said second input current to provide said output current proportional to the resulting difference substantially independent of the current gains of said first, said second and said third transistors.

2. A signal combining circuit as claimed in claim 1 wherein:

each of said first and said second current sources has a source impedance substantially larger than twice the reciprocal of the transconductance of said first transistor.

3. A signal combining circuit as claimed in claim 1 having:

a multiple currents supply;

fourth and fifth transistors, respectively included in said first and said second current sources, said fourth and said fifth transistors each having a collector electrode, which said collector electrodes are connected to said first and said second input terminals, said fourth and said fifth transistors each having an emitter electrode coupled to said multiple currents supply and each having a base electrode;

means for applying input signals between said base electrodes of said fourth and said fifth transistors and means coupling said second input terminal to said multiple currents supply to provide for an auxiliary bias current flow therebetween.

4. A signal combining circuit as claimed in claim 2 having:

means coupling said output terminal to said multiple current supply to provide for current flow therebetween substantially equal to said auxiliary bias current flow.

* * * * *

UNITED STATES PATENT OFFICE

CERTIFICATE OF CORRECTION

PATENT NO. : 3,840,819

DATED : October 8, 1974

INVENTOR(X) : Steven Alan Steckler

It is certified that error appears in the above-identified patent and that said Letters Patent are hereby corrected as shown below:

Col. 1, line 34, delete "the". Col. 4, after line 56, insert the following:

a multiple currents supply;

fourth and fifth transistors, respectively included in said first and said second current sources, said fourth and said fifth transistors each having a collector electrode, which said collector electrodes are connected to said first and said second input terminals, said fourth and said fifth transistors each having an emitter electrode coupled to said multiple currents supply and each having a base electrode;

means for applying input signals between said base electrodes of said fourth and said fifth transistors;

means coupling said second input terminal to said multiple currents supply to provide for an auxiliary bias current flow therebetween;

Col. 5, line 9, cancel beginning with "3. A signal combining" to and including "bias current flow therebetween." in Col. 6, line 9.

Signed and Sealed this second Day of September 1975

[SEAL]

Attest:

RUTH C. MASON
*Attesting Officer*

C. MARSHALL DANN
*Commissioner of Patents and Trademarks*